United States Patent [19]

Jinbo et al.

[11] Patent Number: 4,947,378
[45] Date of Patent: Aug. 7, 1990

[54] MEMORY ELEMENT EXCHANGE CONTROL CIRCUIT CAPABLE OF AUTOMATICALLY REFRESHING A DEFECTIVE ADDRESS

[75] Inventors: Toshikatsu Jinbo; Hiroyuki Kobatake, both of Tokyo, Japan

[73] Assignee: NEC Corporation, Tokyo, Japan

[21] Appl. No.: 194,615

[22] Filed: May 16, 1988

[30] Foreign Application Priority Data

May 15, 1987 [JP] Japan ................................. 62-119718

[51] Int. Cl.$^5$ .............................................. G11C 7/00
[52] U.S. Cl. .................................... 365/222; 365/200; 365/218
[58] Field of Search ................. 365/222, 53, 201, 200, 365/210, 185, 218; 371/10

[56] References Cited

U.S. PATENT DOCUMENTS

| | | | |
|---|---|---|---|
| 4,218,764 | 8/1980 | Furuta et al. ........................ | 365/222 |
| 4,292,676 | 9/1981 | Henig .................................. | 365/222 |
| 4,360,903 | 11/1982 | Plachno et al. ..................... | 365/222 |
| 4,519,050 | 5/1985 | Folmsbee ........................ | 365/200 X |
| 4,592,024 | 5/1986 | Sakai et al. .......................... | 365/200 |
| 4,656,609 | 4/1987 | Higuchi et al. ..................... | 365/200 |
| 4,745,582 | 5/1988 | Fukushi et al. ..................... | 365/200 |

Primary Examiner—Stuart N. Hecker
Assistant Examiner—Andrew L. Sniezek
Attorney, Agent, or Firm—Sughrue, Mion, Zinn, Macpeak & Seas

[57] ABSTRACT

A redundant address memory circuit is used in a memory element exchange circuit associated to a memory matrix composed of FAMOS memory cells and provided with a redundant memory array composed of FAMOS memory cells. The redundant address memory circuit comprises a FAMOS memory cell for storing a defective address, and an output circuit connected to the defective address storing FAMOS memory cell for generating an output signal corresponding to the content of the defective address storing FAMOS memory cell. In addition, there is provided a circuit connected to the defective address storing FAMOS memory cell and to the output circuit for receiving the content of the defective address storing FAMOS memory cell through the output circuit so as to write the content of the defective address storing FAMOS memory cell into the defective address storing FAMOS memory cell when a new data is written to the memory matrix.

9 Claims, 5 Drawing Sheets

MEMORY ELEMENT EXCHANGE CONTROL CIRCUIT CAPABLE OF AUTOMATICALLY REFRESHING A DEFECTIVE ADDRESS

BACKGROUND OF THE INVENTION

1. Field of the Invention

The present invention relates to a memory element exchanging circuit for a redundant memory, and more specifically to a memory element exchanging circuit for non-volatile semiconductor memory composed of the example floating-gate field effect transistor memory elements.

2. Description of Related Art

As well known, a floating-gate avalanche-injection metal-oxide-semiconductor field effect transistor (called "FAMOS" hereinafter) comprise a P-type substrate having N+-diffusion source and drain regions formed on a surface of the substrate separately from each other so as to form a channel region between the source and the drain. A floating gate is formed on the channel region through an insulating layer and a control gate is formed on the floating gate through another insulating layer.

In the above mentioned FAMOS, when the floating gate is an electrically neutralized condition, the FAMOS will be rendered conductive with application of a relatively low control gate voltage, for example 2 volts. Further, a high voltage, for example 20, volts is applied between the control gate and the drain, electrons will be injected to the insulated floatig gate, so that a threshold voltage of the memory element to the control gate will be elevated. Namely, in the case that the insulated floating gate hold the injected electrons, the FAMOS cannot be rendered conductive unless a high control gate voltage such as 8 volts is applied.

Accordingly, when the floating gate is in an electrically neutralized condition (called a "non-written condition" hereinafter), the FAMOS will be rendered conductive with application of a low control gate voltage. On the other hand, if the electrons are injected to the insulated floating gate (called a "written condition" hereinafter), since the FAMOS has an elevated threshold voltage as mentioned above, the FAMOS cannot be rendered conductive unless a high control gate voltage such as 8 volts is applied. Namely, the FAMOS is no longer rendered conductive with a low control gate voltage. Thus, the FAMOS can store a binary data of "0" or "1" by utilizing the change of the threshold voltage.

In addition, if the control gate, the source and the drain of the FAMOS in the written condition are grounded, and a ultraviolet light is irradiated to the surface of the FAMOS, the electrons held in the floating gate are excited and then discharged via the control gate or the substrate. As a result, the threshold voltage will be decreased and the FAMOS will be returned to the non-written condition. Namely, it becomes possible to write a new data to the FAMOS by executing the above mentioned writing operation.

As mentioned above, the FAMOSs can permanently store a binary data and can rewrite the stored data after erasing by the ultraviolet light irradiation. Therefore, the FAMOSs are widely used to constitute a non-volatile semiconductor memory. Namely, some of non-volatile semiconductor memories are composed of a number of FAMOSs arranged in the form of a matrix so as to form a memory array.

On the other hand, a large capacity of non-volatile semiconductor memories are demanded at present. However, if the capacity of the semiconductor memories is increased, it will become difficult to manufacture all memory elements included in the semiconductor memory with no defect. Therefore, it is a greatly way to provide additional memory elements (called "redundant memory element" hereinafter), and to use the redundant memory elements in place of a defective memory elements.

For replacement or exchange between the defective memory element and the redundant memory element, there has been provided a memory element exchange control circuit adapted to store an address of a defective memory element (which address will be called a "defective address" hereinafter) and to selectg the redundant memory element when the defective address is accessed.

Hitherto, the memory element exchange control circuit has include a FAMOS for storing the defective address. But, if the FAMOS storing the defective address had been the same as those of the non-volatile memory, when the memory is irradiated with a ultraviolet light for erase, the defective address would be erased together with the data stored in the non-volatile memory to be rewritten. Therefore, in order to protect the content of the FAMOS storing the defective address, the FAMOS of the memory element exchange control circuit is isolated from the ultraviolet light for erase as far as possible. For example, the FAMOS of the memory element exchange control circuit has been covered with a ultraviolet light interception aluminum overcoating connected to the source region. This is effective to some extent. But, it is not possible to completely cover the gate signal line portion and the drain signal line portion of the FAMOS with the ultraviolet light interception aluminum overcoating, and therefore, the ultraviolet light will be injected through the gate signal line portion and the drain signal line portion of the FAMOS. As a result, with repeated ultraviolet light erase operations, the content of the FAMOS storing the defective address will be gradually lost.

This is a serious problem, because it has been a general practice to write the defective address only one time before the non-volatile memories is shipped and because a user, who would repeatedly erase and write the non-volatile memory, cannot generally rewrite the defective address to the memory element in the memory element exchange control circuit.

SUMMARY OF THE INVENTION

Accordingly, it is an object of the present invention to provide a memory element exchange control circuit which has overcome the above mentioned defect of the conventional one.

Another object of the present invention is to provide a memory element exchange control circuit for a non-volatile memory, capable of maintaining the defective address data without being erased by the ultraviolet light erasing operation.

A further object of the present invention is to provide a memory element exchange control circuit for a non-volatile memory composed of FAMOSs and capable of automatically refreshing a memory element which stores the defective address, in a data writing operation after the non-volatile memory is erased by a ultraviolet light irradiation.

The above and other objects of the present invention are achieved in accordance with the present invention by a redundant address memory circuit used in a memory element exchange circuit associated to a memory matrix composed of non-volatile memory elements and provide with a redundant memory array, comprising a non-volatile memory element for storing a defective address, an output circuit connected to the defective address storing non-volatile memory element for generating an output signal corresponding to the content of the defective address storing non-volatile memory element, and an input circuit connected to the defective address storing non-volatile memory element and the output circuit for receiving the content of the defective address storing non-volatile memory element through the output circuit so as to write the content of the defective address storing non-volatile memory element into the defective address storing non-volatile memory element when a new data is written to the memory matrix.

Preferably, the memory matrix is composed of FAMOS memory cells, and the defective address storing non-volatile memory element is composed of FAMOS memory cell covered with a ultraviolet light intercept shield so that the memory matrix is erased by irradiating the ultraviolet light to the surface of the memory matrix. In a more preferred embodiment, the defective address storing FAMOS memory cell is substantially surrounded by a guard ring formed in a substrate in which the defective address storing FAMOS memory cell is formed, the guard ring being connected to the power supply voltage.

In one embodiment, the input circuit includes an input gate circuit receiving defective address write signal, a program control signal and an output of the output circuit, a first inverter connected to an output of the input gate circuit, a first MOS transistor connected at a gate thereof to the output of the intput gate circuit, the first transistor being connected at one end thereof to a power supply voltage and at the other end thereof to a gate of the defective address storing FAMOS memory cell, a second MOS transistor connected at a gate thereof to the output of the inverter, the second transistor being connected at one end thereof to a write voltage higher than the power supply voltage and at the other end thereof to a gate of the defective address storing FAMOS memor cell, a third MOS transistor connected at a gate thereof to the output of the inverter, the third transistor being connected at one end thereof to the write voltage higher than the power supply voltage and at the other end thereof to one end of the defective address storing FAMOS memory cell, the other end of the defective address storing FAMOS memory cell being grounded, and the connection node between the third transistor and the defective address storing FAMOS memory cell being connected to an input of the output circuit.

More specifically, the connection node between the third transistor and the defective address storing FAMOS memory cell is connected to the input of the output circuit through a fourth MOS transisitor connected in the form of a load, the input of the output circuit being pulled up to the power supply voltage through a fifth MOS transistor connected in the form of a load.

In addition, the output circuit is a second inverter having an input connected through the fourth MOS transistor to the connection node between the third transistor and the defective address storing FAMOS memory cell, an output of the second inverter being connected to the input gate circuit.

Furthermore, the input gate circuit includes a first NOR gate having a first input connected to receive the program control signal and a second input connected to the output of the second inverter, and a second NOR gate having a first input connected to an output of the first NOR gate and a second input connected to receive the defective address write signal, an output of the second NOR gate constituting the output of the input gate circuit.

Alternative, the input gate circuit includes a first NOR gate having a first input connected to receive the program control signal and a second input connected to the output of the second inverter, and a level shift circuit having an input connected to an output of the first NOR gate, a third inverter connected between a output of the level shift circuit and the power supply voltage and having an input connected to receive the defective address write signal, an output of the third inverter being connected to the input of the first inverter.

The above and other objects, features and advantages of the present invention will be apparent from the following description of preferred embodiments of the invention with reference to the accompanying drawings.

DESCRIPTION OF THE PREFERRED EMBODIMENT

Figure 1:
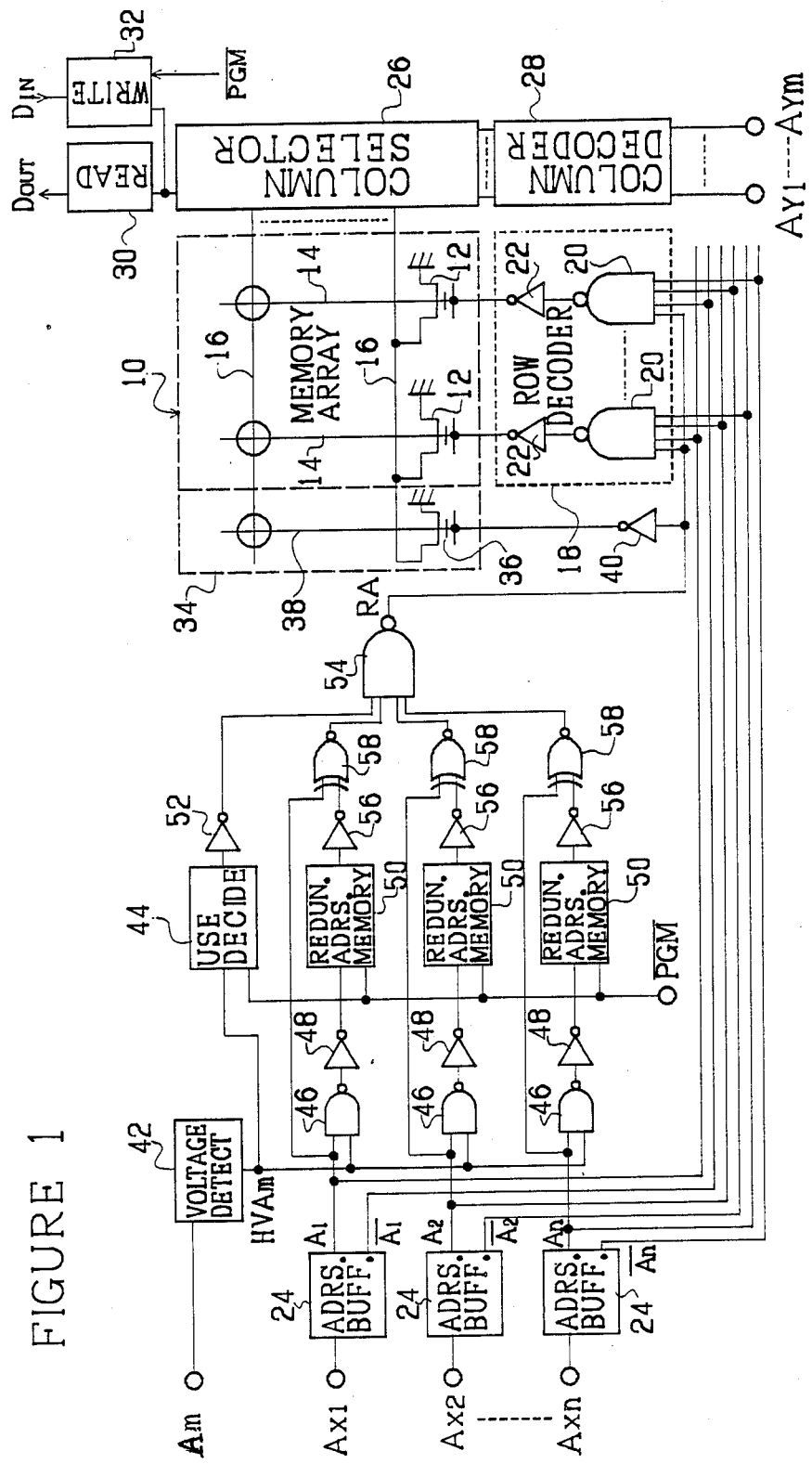
FIG. 1 is a block diagram of an example of a programmable read-only memory (PROM) including non-volatile memory elements and provide with a memory element exchange control circuit in accordance with the present invention.

Referring to FIG. 1, there is shown an example of a programmable read-only memory (PROM) including non-volatile memory elements and provided with a memory element exchange control circuit in accordance with the present invention.

The shown PROM includes a memory array 10 composed of a number of FAMOSs 12 arranged in the form of a matrix. FAMOSs 12 located in each of rows are connected at their control gates to one word line 14, and FAMOSs 12 located in each of columns are connected at their drains to one bit line 16. All FAMOSs 12 are grounded at their sources. All the word lines 14 are connected to a row decoder 18, which have an array of NAND gates 20. Each of the NAND gates 20 has an output connected through an inverter 22 to a corresponding word line 14. Further, a plurality of inputs of each NAND gate 20 are connected to selected ones of non-inverted outputs and inverted outputs of address buffers 24 which receive address signals through word address input pins AX1, AX2, . . . and AXn, respectively.

In addition, all the bit lines 16 are connected to a column selector 26, which is coupled at its input to a column decoder 28 which is connected to bit address signal pins AY1, . . . AYm, respectively. The column selector 26 is also connected to a read circuit 30 for outputting a read-out data Dout and a write circuit 32 for receiving a write data Din. This write circuit also receives a program control signal $\overline{PGM}$.

Furthermore, the shown non-volatile memory 10 additionally includes a redundant memory 34 composed of one row of FAMOSs 36, which are connected at their drains to corresponding bit lines 16 and grounded at their sources. Gates of all the FAMOSs 36 are commonly connected to a redundant word line 38, which is connected to an output of an inverter 40. Namely, a redundant memory is provided to a word address of the memory matrix.

For the redundant memory, there is provided a memory element exchange control circuit, which includes a high voltage detection circuit 42 receives a signal through a pin Am redundant to the pin AX1, . . . AXn in the word address system. This high voltage detection circuit 42 operates to output a high level signal HVAm when a high voltage signal such as 12 volts in applied through the pin Am. This signal HVAm is supplied to a redundant memory use decision circuit 44 and also one input of each of NAND gates 46, each of which is connected to receive a non-inverted output of a corresponding address buffer 24. An output of each NAND gate 46 is connected through an inverter 48 to a corresponding one of redundant address memory circuits 50. In addition, the program control signal $\overline{PGM}$ is applied to the redundant memory use decision circuit 44 and the redundant address memory circuit 50. An output of the redundant memory use decision circuit 44 is connected through a inverter 52 to a NAND gate 54. An output of each redundant address memory circuit 50 is connected through an inverter 56 to one input of an exclusive-NOR gate 58. Each of the exclusive-NOR gate 58 is connected to receive at its other input the non-inverted output of the corresponding address buffer 24. An output of each exclusive-NOR gate 58 is connected to the NAND gate 54. An output of the NAND gate 54 is connected to the input inverter 40 associated to the redundant memory 34 and each of the NAND gates 20 of the row decoder 18.

In the PROM mentioned above, if a defective memory element is found, one row of memory elements including the defective memory element is replaced or exchanged by the redundant memory 34. For this purpose, an address indicating the defective memory element is applied to the address input pin AX1, . . ., AXn, and in this condition, a high voltage such as 12 volts is applied to the pin Am. As a result, the redundant memory use decison circuit 44 is written by the high voltage signal HVAm to output a high level signal. Further, the high level signal HVAm is written to only the redundant address memory circuits 50 corresponding to the address buffers 24 which output a high level of non-inverted signal. Thus, the defective address is written in an array of redundant address memory circuits 50.

In a reading operation, if the word address inputted through the address input pins AX1, . . ., AXn is perfectly consistent with the defective address held in the array of redundant address memory circuits, 50, all the exclusive-NOR gates 58 output a high level signal to the NAND gate 54. At this time, the output of the redundant memory use decision circuit 44 is at the high level as mentioned above, the NAND gate 54 outputs a low level signal RA to the inverter 40 and the NAND gates 20 of the row decoder 18. Accordingly, the decoder 18 and hence all the associated word lines 14 are not selected and the redundant word line 38 is selected.

Figure 2:
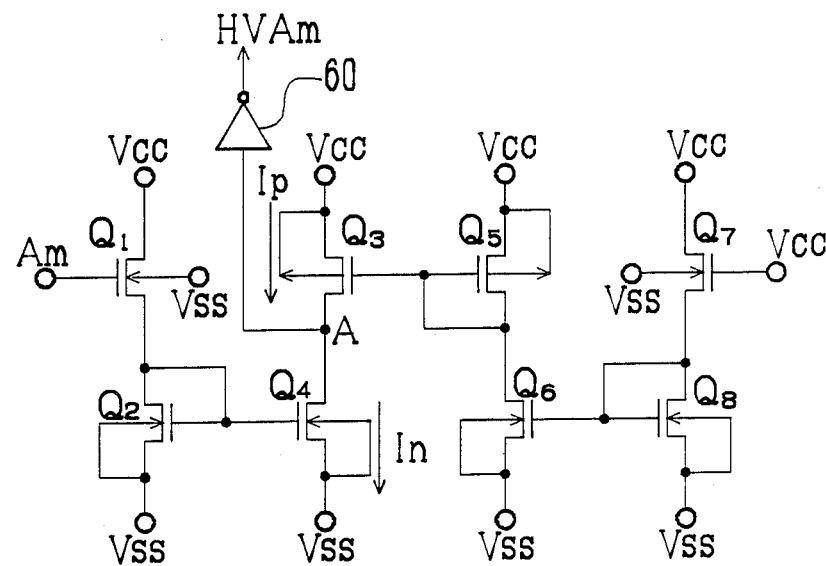
FIG. 2 is a circuit diagram of a high voltage detection circuit used in the PROM shown in FIG. 1.

Referring to FIG. 2, there is shown one example of the high voltage detection circuit 42. The shown circuit includes four pairs of series-connected MOS transistors Q1 and Q2, Q3 and Q4, Q5 and Q6, and Q7 and Q8. Each pair of MOS transistors are connected between a power supply voltage Vcc and the ground potential Vss. The transistor Q1 connected at its drain to the power supply voltage Vcc is of the n-channel type and is connected at its gate to the pin Am. The transistor Q2 series-connected to the transistor Q1 is also of the n-channel type and has a gate connected to a drain of the transistor Q2 itself so as to function a load resistor for the transistor Q1. The gate of the transistor Q2 is also connected to a gate of the transistor Q4 which is also of the n-channel type. A drain of this transistor Q4 is connected to a drain of the transistor Q3 which is of the p-channel type. The transistor Q3 is connected at its gate to a gate of the transistor Q5 which is also of the p-channel type. This transistor Q5 has a gate connected to a drain of the transistor Q5 itself, and the drain of the transistor Q5 is connected to a drain of the transistor Q6 of the n-channel type. A gate of the transistor Q6 is connected to a gate of the transistor Q8, which has a drain connected to the gate of the transistor Q8 itself to function a load resistor. In additon, the drain of the transistor Q8 is connected to a source of the transistor Q7 of the n-channel type, which has a gate connected to the power supply voltage Vcc. Furthermore, the connection node "A" between the drains of the transistors Q3 and Q4 is connected to inverter 60, which generates the above mentioned high level signal HVAm.

Figure 3:
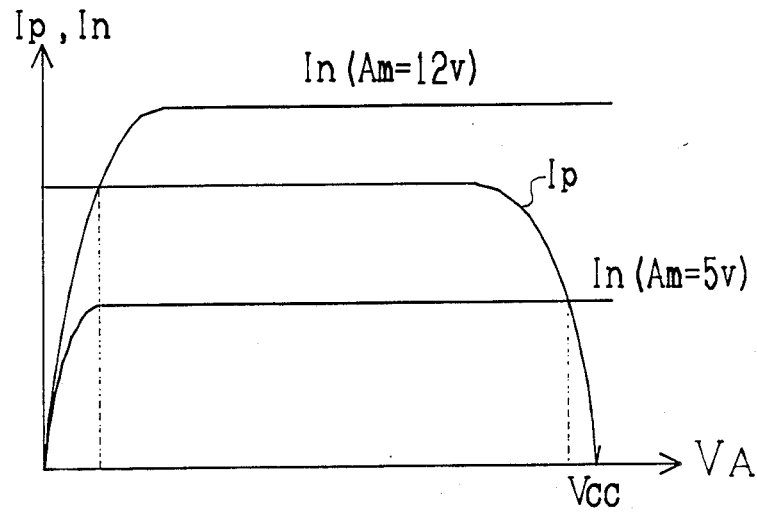
FIG. 3 is a graph illustrating the current characteristics of the circuit shown in FIG. 2.

In the above mentioned circuit, a current Ip flowing through the transistor Q3 and a current In flowing through the transistor Q4 have characteristics as shown in FIG. 3.

Thus, if a voltage not greater than 5 volts is applied to the input pin Am, a voltage VA of the node "A" is made to a high level. However, if a high voltage such as 12 volts is applied to the input pin Am, the node "A" assumes a low level as seen from FIG. 3, which low level signal is converted into a high level signal HVAm by the inverter 60.

Ordinarily, users do not use a voltage greater than 5 volts, and therefore, the output HVAm of this circuit is fixed to the low level. Incidentally, the voltage level of the input pin Am determining whether or not the output HVAm is at a high level is set by the dimensions of the respective transistors Q1 to Q8.

Figure 4:
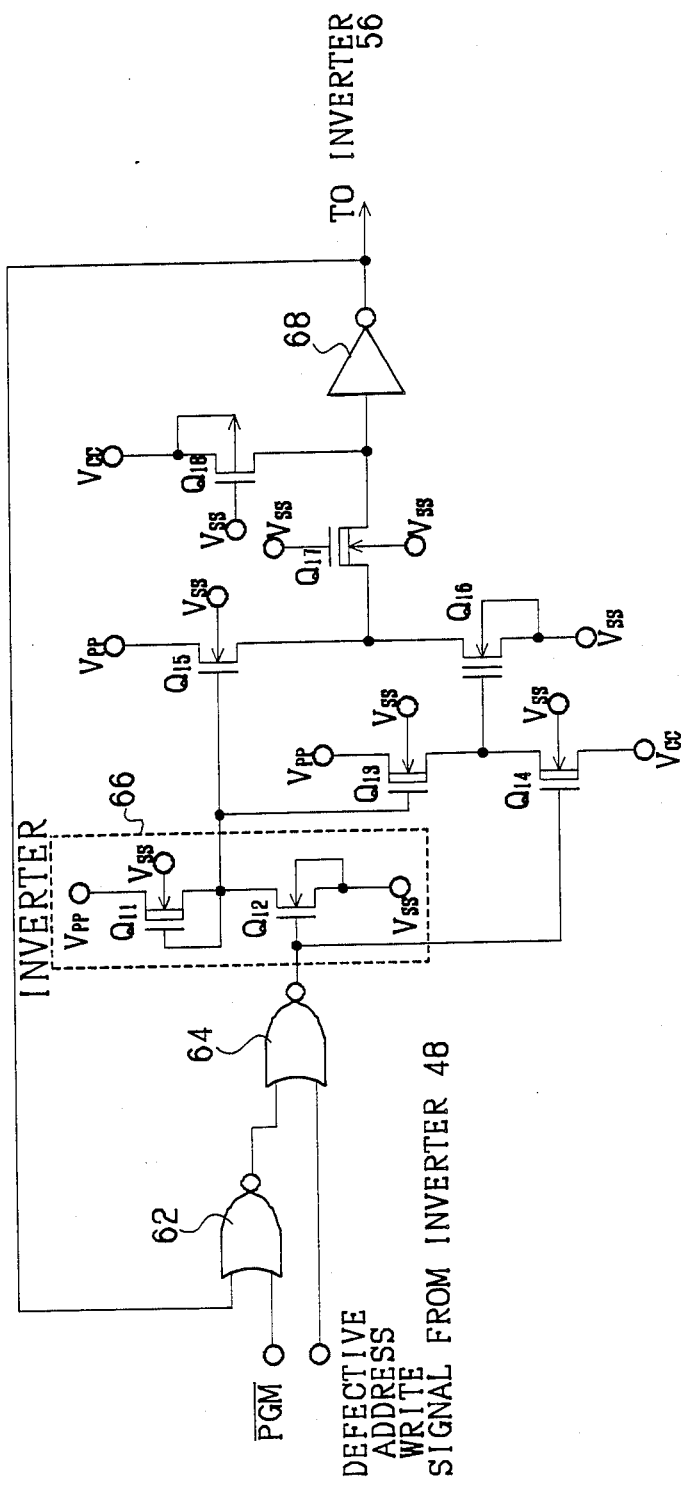
FIG. 4 is a circuit diagram illustrating one embodiment of the redundant address memory circuit used in the PROM shown in FIG. 1.

Referring to FIG. 4, there is shown a circuit diagram of one embodiment of the redundant address memory circuit 50 in accordance with the present invention. The shown circuit 50 has a NOR gate 62 connected to receive at its one input the program control signal $\overline{PGM}$. An output of the NOR gate 62 is connected to one input of another NOR gate 64, which other input is connected to receive a defective address write signal outputted from the inverter 48.

An output of the NOR gate 64 is connected to an inverter 66, which includes a pair of n-channel MOS transistor Q11 and Q12. The transistor Q11 is of the depletion type and has a drain connected to a write voltage Vpp and a source connected to a gate of the transistor Q11 itself and a drain of the transistor Q12. A gate of the transistor Q12 is connected to the output of the NOR gate 64 and a source connected to ground potential Vss. The connection node between the transistors Q11 and Q12 is connected to a gate of a n-channel transistor Q13, and the output of the NOR gate 64 is connected to a gate of a n-channel transistor Q14. These transistors Q13 and Q14 are of the depletion type and are connected at their sources to each other. A drain of the transistor Q13 is connected to the write voltage Vpp and a drain of the transistor Q14 is connected to a power supply voltage Vcc.

In additon, the connection node between the transistors Q11 and Q12 is connected to a gate of a n-channel transistor Q15, and the connection node between the transistors Q13 and Q14 is connected to a control gate of a n-channel FAMOS Q16. The transistors Q15 and Q16 are connected in series between the write voltage Vpp and the ground potential Vss, and a connection node between these transistors Q15 and Q16 is connected through a depletion type n-channel MOS transistor Q17 to an inverter 68. The transistor Q17 is connected at its gate and at its substrate to the ground potential Vss. A connection node between the transistor Q17 and the inverter 68 is connected to the power supply voltage Vcc through a p-channel MOS transistor Q18 having a grounded gate so as to function as a road resistor. An output of the inverter 68 is connected to the inverter 56 shown in FIG. 1 and also to the other input of NOR gate 62.

Figure 5:
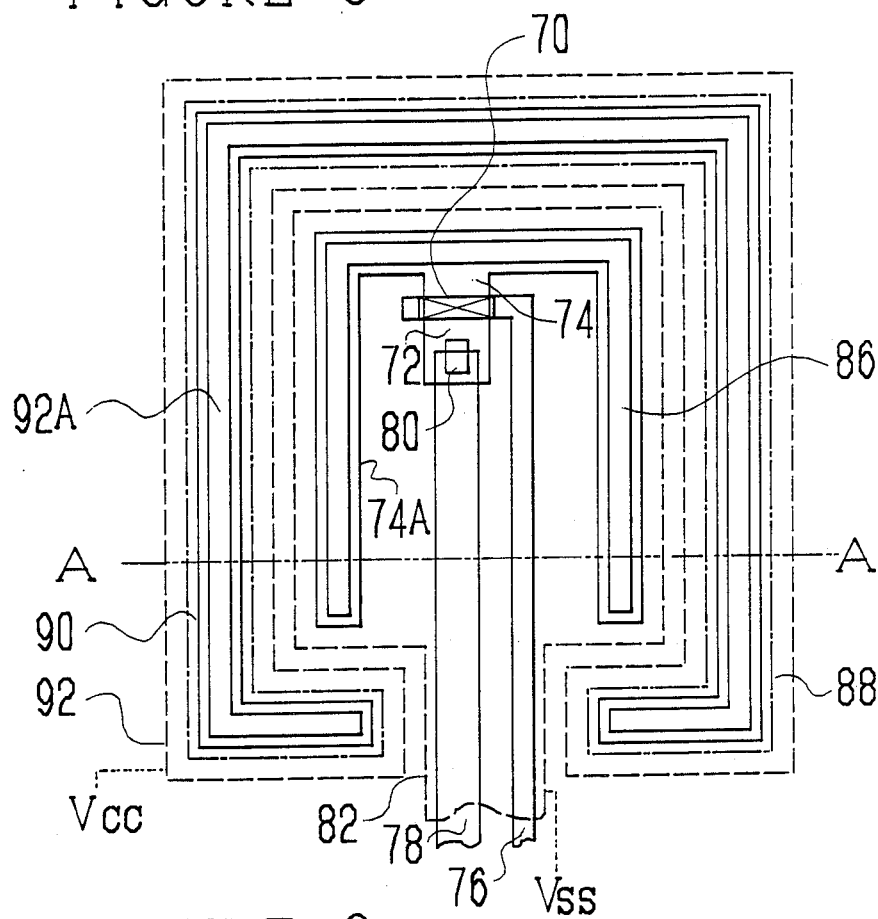
FIG. 5 is a plan view illustrating the FAMOS memory cell used in the redundant address memory circuit shown in FIG. 4.
Figure 6:
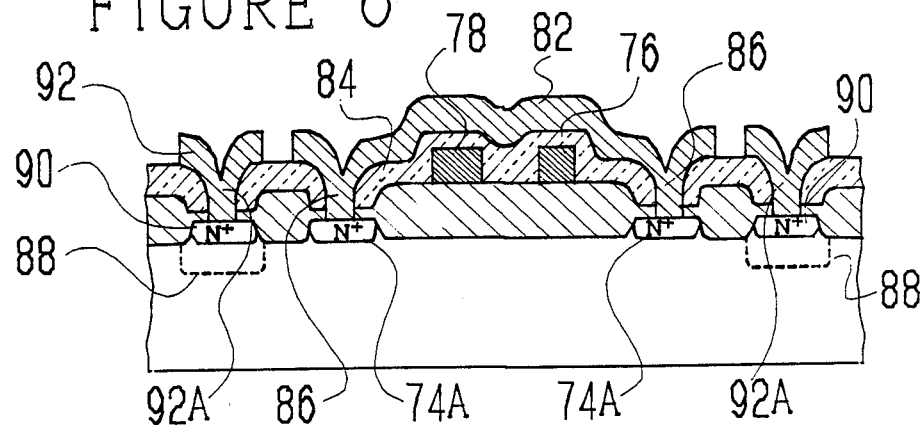
FIG. 6 is a section view taken along the line A—A in FIG. 5.

Turning to FIGS. 5 and 6, there are shown a plane view and a sectional view of the FAMOS Q16. The shown FAMOS includes a floating gate and a control gate superposed a portion indicated by Reference Numeral 70, which is positioned between a drain diffusion region 72 and a source diffusion region 74. A gate signal line 76 extends downwardly from the control gate, and a drain signal line 78 is connected at its upper end to the drain region 72 through a direct contact hole 80 and downwardly extends in parallel to but separate from the gate signal line 76.

As seen from FIG. 5, the source region 74 has a U-shaped portion 74A extending to surroud three sides of four peripheral sides of the gates and the drain region 72, and in addition, an aluminum overcoating 82 is provided to cover, through an insulting interlayer 84, the gate signal line 76 and the drain signal line 78 and the inside of the area surrounded by the U-shaped source region portion 74A. This aluminum overcoating 82 is connected to the U-shaped source region portion 74A through a contact hole 86 which is formed to extend over the whole of the U-shaped portion 74A of the source region 74. The aluminum overcoating 82 functions to intercept the ultraviolet light irradiated for erasing the content of the PROM.

Further, there is provided a n-well 88 formed to surround the FAMOS cell except for a portion crossing the gate signal line 76 and the drain signal line 78. The n-well 88 has n+ diffusion region 90 formed in an upper portion thereof. A aluminum overcoating 92 is provided to cover the n-well 88 and its proximity and is connected to the n+ diffusion region 90 through a contact hole 92A formed to extend over the whole of the n+ diffusion region 90. This overcoating 92 is fixed to the power supply voltage Vcc. With this arrangement, even if the FAMOS cell surrounded by the n-well 88 operates in a snap-back region (negative resistance region), electrons generated will be absorbed by the n-well 88 and the n+ diffusion region 90. Namely, the n-well 88 and the n+ diffusion region 90 function as a guard ring.

The use decision circuit 44 is constructed similarly to the redundant address memory circuit 50 except that the signal HVAm of the detection circuit is directly inputted to the NOR gate 64.

The circuit shown in FIG. 4 operates as follows;

In order to write a defective address, the defective address write signal is brought to a high level as seen the above mentioned explanation. As a result, the output of the NOR gate 64 is rendered to a low level, so that the transistor Q14 is maintained off. On the other hand, the inverter 66 outputs a write voltage Vpp to the gates of the transistors Q13 and Q15, so that the write voltage Vpp is applied to the drain and gate of the FAMOS Q16. Namely, the FAMOS Q16 is put into a written condition.

In the case that the PROM is read, the defective address write signal is at a low level and the write control signal $\overline{PGM}$ is at a high level. Therefore, the output of the NOR gate 64 is brought into a high level, and the output of the inverter 66 is made to a low level. Accordingly, the transistors Q13 and Q15 are maintained off and the transistor Q14 is turned on so that the power supply voltage Vcc is applied to the gate of the FAMOS Q16.

At this time, if the FAMOS Q16 is in the witten condition, the FAMOS Q16 is maintained off even if the Vcc is applied to the gate of the FAMOS. Namely, the input of the inverter 68 is maintained at a high level, so that the inverter 68 outputs a low level signal to the inverter 56.

If the FAMOS Q16 is in the non-written condition, the FAMOS Q16 is turned on with application of the Vcc to the gate of the FAMOS. Therefore, at this time, if the transistor Q18 is adjusted to have a sufficiently high condition resistance, the input of the inverter 68 is discharged through the transistors Q17 and Q16, and so, is brough to a low level, so that the inverter 68 outputs a high level signal to the inverter 56.

After a ultraviolet light is irradiated to the surface of the PROM to erase the content of the PROM, a new data can be written to the PROM. At this time, if the FAMOS Q16 is in the written condition, the output of the inverter 68 is at a low level. Therefore, when the write control signal $\overline{PGM}$ is brought to a low level, the NOR gate 62 outputs a high level signal to the NOR gate 64, and the NOR gate 64 outputs the low level signal since the defective address write signal is fixed to a low level. Accordingly, the FAMOS Q16 is written.

On the other hand, if the FAMOS Q16 is in the non-written condition, the output of the inverter 68 is at a hgh level. Therefore, even if the write control signal $\overline{PGM}$ is brought to a low level, the NOR gate 62 will not output a high level signal to the NOR gate 64, and so, the NOR gate 64 maintains its high level output signal since the defective address write signal is fixed to a low level. Accordingly, the FAMOS Q16 is not written.

As seen from the above, the FAMOS Q16 storing the defective address is automatically refreshed in the writing or programming operation made after a ultraviolet light is irradiated to the surface of the PROM to erase the content of the PROM. Accordingly, even if the carriers held in the FAMOS Q16 storing the defective address is partially lost due to the irradiated ultraviolet light which is injected through a slight optical gap between the gate and drain signal lines 76 and 78 and the aluminum overcoating 82, the FAMOS Q16 will be supplemented with new carriers of the amount corresponding to that of the lost carriers. Namely, the content of the FAMOS storing the defective address will not lost.

Figure 7:
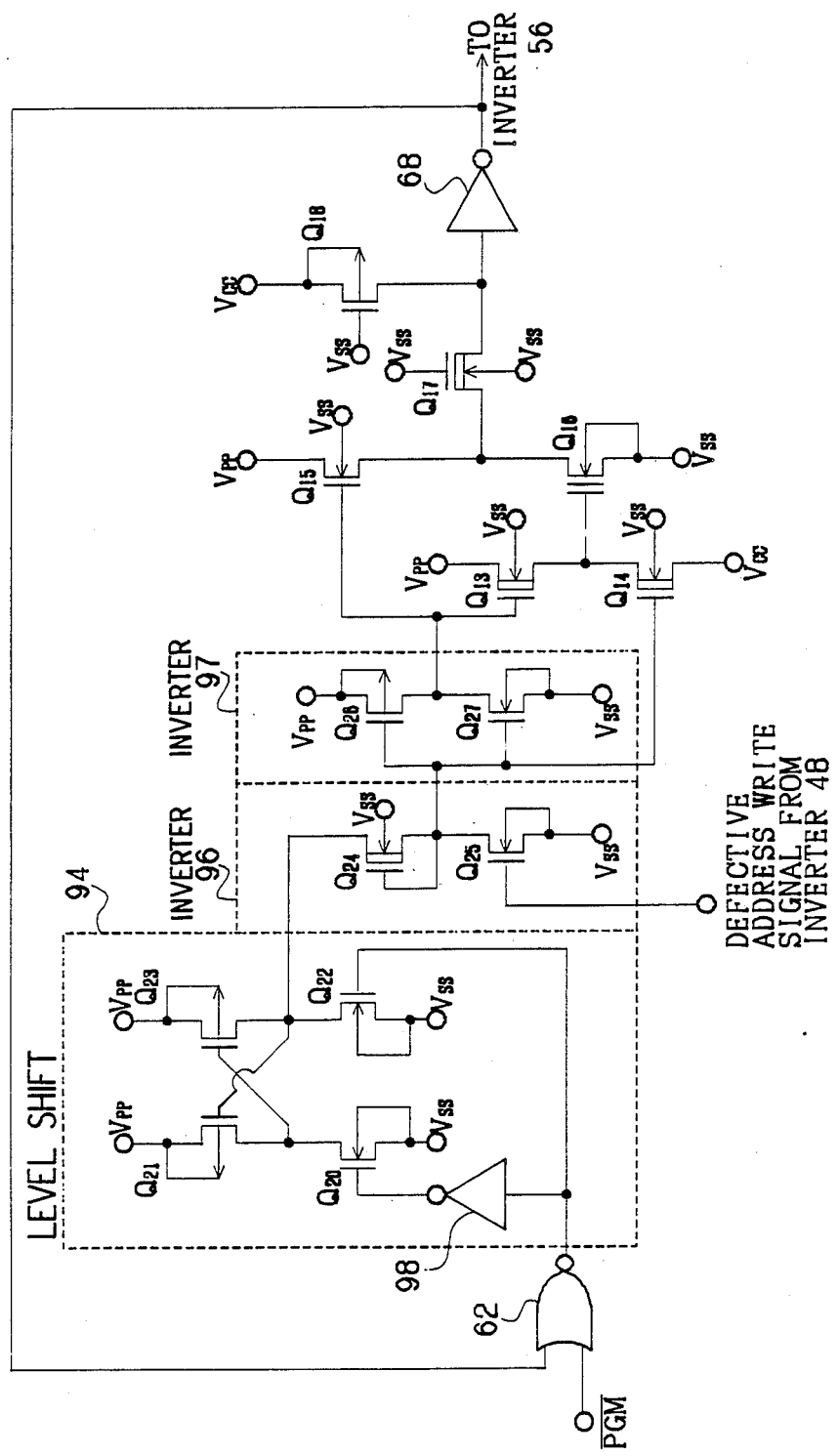
FIG. 7 is a circuit diagram illustrating another embodiment of the redundant address memory circuit used in the PROM shown in FIG. 1.

Referring to FIG. 7, there is shown a second embodiment of the redundant address memory circuit 50 in accordance with the present invention. In FIG. 7, circut elements similar to those shown in FIG. 4 are given the same Reference Numerals and explanation thereof will be omitted.

As seen from comparison between FIGS. 4 and 7, a level shift circuit 94 and a pair of inverters 96 and 97 are provided in place of the NOR gate 64 and the inverter 66. Namely, the output of the NOR gate 62 is connected to the level shift circuit 64, which includes a pair of n-channel MOS transistors Q20 and Q22. One of the transistors Q20 has a gate connected through an inverter 98 to the output of the NOR gate 62 and the other transistor Q22 has a gate directly connected to the output of the NOR gate 62. These transistors Q20 and Q22 are grounded at their sources, and connected at their drains to the write voltage Vpp through a pair of p-channel transistors Q21 and Q23, respectively. These transistors Q21 and Q23 are cross-coupled in such a manner that each of the transistors has a gate connected to the drain of the other transistor.

The connection node between the transistors Q22 and Q23 is connected to a drain of a depletion type n-channel MOS transistor Q24 provided in the inverter 96. This transistor Q24 has a gate connected to a source of the transistor Q24 itself. The source of the transistor Q24 is connected to a drain of a n-channel MOS transistor 25 having a grounded source, and a gate which is connected to receive the defective address write signal from the inverter 48. The connection node between the transistors Q24 and Q25 is connected to the gate of the transistor Q14 and also the gates of a pair of p-channel MOS transistor Q26 and n-channel MOS transistor Q27 series-connected between the write voltage Vpp and the ground voltage Vss so as to form the inverter 97. The connection node between the transistors Q26 and Q27 is connected to the gate of the transistors Q13 and Q15.

The circuit shown in FIG. 7 operates as follows:

In order to write a defective address, if the defective address write signal is brought to a high level as seen the above mentioned explanation, the output of the inverter 96 is rendered to a low level, so that the inverter 97 outputs a write voltage Vpp to the gates of the transistors Q13 and Q15. Accordingly, the write voltage Vpp is applied to the drain and gate of the FAMOS Q16. Namely, the FAMOS Q16 is put into a written condition.

When the PROM is read, the write control signal $\overline{PGM}$ is brought to a high level. Therefore, the output of the NOR gate 62 is brought into a low level, so that the level shift circuit 94 outputs a high level signal (the write voltage Vpp is ordinarily made at the same level as that of the power supply voltage Vcc in the reading operation).

At this time, since the defective address signal is at a low level, the output of the inverter 96 is made to a high level, and therefore, the output of the inverter 97 is made to a low level. Accordingly, the transistors Q13 and Q15 are maintained off and the transistor Q14 turned on. Therefore, the power supply voltage Vcc is applied to the gate of the FAMOS Q16.

If the FAMOS Q16 is in the written condition, the FAMOS Q16 is maintained off even if the Vcc is applied to the gate of the FAMOS. Namely, the input of the inverter 68 is maintained at a high level, so that the inverter 68 outputs a low level signal to the inverter 56.

If the FAMOS Q16 is in the non-written condition, the FAMOS Q16 is turned on with application of the Vcc to the gate of the FAMOS. Therefore, at this time, if the transistor Q18 is adjusted to have a sufficiently high conduction resistance, the input of the inverter 68 is discharged through the transistors Q17 and Q16, and so, is brought to a low level, so that the inverter 68 outputs a high level signal to the inverter 56.

After a ultraviolet light is irradiated to the surface of the PROM to erase the content of the PROM, a new data can be written to the PROM. At this time, if the FAMOS Q16 is in the written condition, the output of the inverter 68 is at a low level. Therefore, when the write control signal $\overline{PGM}$ is brought to a low level, the NOR gate 62 outputs a high level signal to the level shift circuit 94 so that the output of the level shift circuit 94 becomes a low level. Therefore, the charges on the node between the transistors Q24 and Q25 will be discharged through the transistors Q24 and Q22. Namely, the gates of the transistors Q26 and Q27 are brought to a low level so that the output of the inverter 97 becomes a high level. Accordingly, the FAMOS Q16 is written.

On the hand, if the FAMOS Q16 is in the non-written condition, the output of the inverter 68 is at a hight level. Therefore, even if the write control signal $\overline{PGM}$ is brought to a low level, the NOR gate 62 will not output a high level signal to the level shift circuit 94, and so, the node between the transistors Q24 and Q25 is maintained at a high level since the defective address write signal is fixed to a low level. Accordingly, the FAMOS Q16 is not written.

In first embodiment shown in FIG. 4, when the transistor Q 12 is turned on, a current flows through the transistors Q11 and Q12 from the Vpp to the Vss (a through-out current). But, in the second embodiment shown in FIG. 7, the through-out current will not flow because of the level shift circuit 94.

The above mentioned PROM has the redundant memory array in the word address system, but can be modified to have a redundant memory array in the bit address system. In the latter case, the memory matrix has a redundant bit line connected to one column of FAMOSs, and the redundant bit line is selected by a memory element exchange control circuit which is similar to that shown in FIG. 1 but is modified to respond to the bit line address portion.

The invention has thus been shown and described with reference to the specific embodiments. However, it should be noted that the present invention is in no way limited to the details of the illustrated structures but changes and modifications may be made within the scope of the appended claims.

We claim:

1. In a memory device including a memory matrix composed of non-volatile memory elements and coupled to data read/write means, a redundant memory array additionally provided to the memory matrix and used in place of defective memory elements of the memory matrix, and address input circuit receiving a given address and coupled to the memory matrix so as to bring a non-volatile memory element of the memory matrix designated by the given address into a condition accessible by the data read/write means, a memory element exchange circuit storing a defective address indicative of a defective non-volatile memory element of the memory matrix, the memory element exchange circuit being coupled to the address input circuit so as to receive the given address and also coupled to the redundant memory array, the memory element exchange circuit operating in such a manner that when the given address designates the defective non-volatile memory element of the memory matrix, the memory element exchange circuit brings the defective non-volatile memory element into a condition not accessible by the data read/write means, and the redundant memory array into a condition accessible by the data read/write means, the improvement comprising the memory element exchange circuit which includes a redundant address memory circuit, the redundant address memory circuit including a non-volatile memory element for storing said defective address of the memory matrix, an output circuit connected to said defective address storing non-volatile memory element for generating an output signal corresponding to the content of said defective address storing non-volatile memory element, and in input circuit connected to said defective address storing non-volatile memory element and said output circuit for receiving the content of said defective address storing non-volatile memory element through said output circuit so as to write the same content as that which was stored in and read from said defective address storing non-volatile memory element into said defective address storing non-volatile memory element when a new data is written to the memory matrix by said data read/write means.

wherein said memory matrix is composed of FAMOS memory cells and said defective address storing non-volatile memory element is composed of a FAMOS memory cell covered with a ultraviolet light intercept shield so that the memory matrix is erased by irradiating the ultraviolet light to the surface of said memory matrix.

wherein said input circuit includes an input gate circuit receiving a defective address write signal, a program control signal and an output of said output circuit, a first inverter connected to an output of said input gate circuit, a first MOS transistor connected at a gate thereof to the output of said input gate circuit, said first transistor having a current path connected at one end thereof to a power supply voltage and at the other end thereof to a gate of said defective address storing FAMOS memory cell, a second MOS transistor connected at a gate thereof to the output of said inverter, said second transistor having a current path connected at one end thereof to a write voltage higher than said power supply voltage and at the other end thereof to a gate of said defective address storing FAMOS memory cell, a third MOS transistor connected at a gate thereof to the output of said inverter, said third transistor having a current path connected at one end thereof to said write voltage higher than said power supply voltage and at the other end thereof to one end of said defective address storing FAMOS memory cell, the othe end of said defective address storing FAMOS memory cell being grounded, and the connection node between said third transistor and said defective address storing FAMOS memory cell bein connected to an input of said output circuit.

2. A redundant address memory circuit claimed in claim 1 wherein said connection node between said third transistor and said defective address storing FAMOS memory cell is connected to said input of said output circuit through a fourth MOS transistor connected in the form of a load, said input of said output circuit being pulled up to said power supply voltage through a fifth MOS transistor connected in the form of a load.

3. A redundant address memory circuit claimed in claim 1 wherein said output circuit is a second inverter having an input connected through said fourth MOS transistor to said connection node between said third transistor and said defective address storing FAMOS memory cell, an output of said second inverter being connected to said input gate circuit.

4. A redundant address memory circuit claimed in claim 3 wherein said input gate circuit includes a first NOR gate having a first input connected to receive said program control signal and a second input connected to said output of said second inverter, and a second NOR gate having a first input connected to an output of said first NOR gate and a second input connected to receive said defective address write signal, an output of said NOR gate constituting the output of the input gate circuit.

5. A redundant address memory circuit claimed in claim 3 wherein said input gate circuit includes a first NOR gate having a first input connected to received said program control signal and a second input connected to said output of said second inverter, and a level shift circuit having an input connected ot an output of said first NOR gate, a third inverter connected between an output of said level shift circuit and said a ground voltage and having an input connected to received said defective address write signal, an output of said third inverter being connected to said input of said first inverter.

6. In a memory device including a memory matrix composed of non-volatile memory elements and coupled to data read/write means, a redundant memory array additionally provided to the memory matrix and used in place of defective memory elements of the memory matrix, an address input circuit receiving a given address and coupled to the memory matrix so as to bring a non-volatile memory element of the memory matrix designated by the given address into a condition accessible by the data read/write means, a memory element exchange circuit storing a defective address indicative of a defective non-volatile memory element of the memory matrix, the memory element exchange circuit being coupled to the address input circuit so as to receive the given address and also coupled to the redundant memory array, the memory element exchange circuit operating in such a manner that when the given address designates the defective non-volatile memory element of the memory matrix, the memory element exchange circuit brings the defective non-volatile memory element into a condition not accessible by the data read/write means, and the redundant memory array into a condition accessible by the data read/write means, the improvement comprising the memory element exchange circuit which includes a redundant address memory circuit, the redundant address memory circuit including a non-volatile memory element for storing said defective address of the memory matrix, an output circuit connected to said defective address storing non-volatile memory element for generating an output signal corresponding to the content of said defective address storing non-volatile memory element, and an input circuit connected to said defective address storing non-volatile memory element and said output circuit for receiving the content of said defective address storing non-volatile memory element through said output circuit so as to write the same content as that which was stored in and read from said defective address storing non-volatile memory element into said defective address storing non-volatile memory element when a new data is written to the memory matrix by said data read/write means.

7. A redundant address memory circuit claimed in claim 6 wherein said memory matrix is composed of FAMOS memory cells and said defective address storing non-volatile memory element is composed of FAMOS memory cell covered with a ultraviolet light intercept shield so that the memory matrix is erased by irradiating the ultraviolet light to the surface of said memory matrix.

8. A redundant address memory circuit claimed in claim 6 wherein said defective address storing FAMOS memory cell is substantially surrounded by a guard ring formed in a substrate in which said defective address storing FAMOS memory cell is formed, said guard ring being connected to said power supply voltage.

9. In an ultraviolet erasable programmable read-only memory device including a memory matrix composed of FAMOS memory cells which can be erased by radiation of a ultraviolet light, the memory matrix being coupled to data read/write means for data read and data write, a redundant memory array additionally provided to the memory matrix and used in place of defective memory cells of the memory matrix, an address input circuit receiving a given address and coupled to the memory matrix so as to bring a FAMOS memory cell of the memory matrix designated by the given address into a condition accessible by the data read/write means, a memory cell exchange circuit storing a defective address indicative of a defective FAMOS memory cell of the memory matrix, the memory cell exchange circuit being coupled to the address input circuit so as to receive the given address and also coupled to the redundant memory array, the memory cell exchange circuit operating in such a manner that when the given address designates the defective FAMOS memory cell of the memory matrix, the memory cell exchange circuit brings the defective FAMOS memory cell into a condition not accessible by the data read/write means, and the redundant memory array into a condition accessible by the data read/write means, the improvement comprising the memory element exchange circuit which includes a redundant address memory circuit, the redundant address memory circuit including a FAMOS memory cell for storing said defective address of the memory matrix, the FAMOS memory cell of the memory cell exchange circuit being covered with an ultraviolet light intercept shield so that only the memory matrix is erased by irradiating the ultraviolet light to the surface of said memory matrix, an output circuit connected to said defective address storing FAMOS memory cell for generating an output signal corresponding to the content of said defective address storing FAMOS memory cell, and an input circuit connected to said defective address storing FAMOS memory cell and said output circuit for receiving the content of said defective address storing FAMOS memory cell through said output circuit so as to write the same content as that which was stored in and read from said defective address storing FAMOS memory cell into said defective address storing FAMOS memory cell when a new data is written by said data read/write means to the memory matrix in an intial condition or after it is erased by radiation of the ultraviolet light.

* * * * *

UNITED STATES PATENT AND TRADEMARK OFFICE
CERTIFICATE OF CORRECTION

PATENT NO. : 4,947,378
DATED : August 7, 1990
INVENTOR(S) : Toshikatsu JINBO and Hiroyuki KOBATAKE It is certified that error appears in the above-identified patent and that said Letters Patent is hereby corrected as shown below:

Col. 1, line 32, delete "floatig" and insert --floating--.

Col. 2, line 8, delete "greatly" and insert --general--;

Col. 2, line 18, delete "selectg" and insert --select--.

Col. 3, line 48, delete "memor" and insert --memory--.

Col. 4, line 14, delete "Alternative" and insert --Alternatively--.

Col. 7, line 50, delete "surroud" and insert --surround--.

Col. 8, line 62, delete "hgh" and insert --high--.

Col. 9, line 13, after "not" insert --be--;

Col. 9, line 17, delete "circut" and insert --circuit--;

Col. 9, line 25, delete "64" and insert --94--.

Col. 10, line 39, delete "hight" and insert --high--.

Col. 12, line 4, delete "othe" and insert --other--;

Col. 12, line 8, delete "bein" and insert --being--;

Col. 12, line 41, delete "ot" and insert --to--;

Col. 12, line 44, delete "received" and insert --receive--;

UNITED STATES PATENT AND TRADEMARK OFFICE
CERTIFICATE OF CORRECTION

PATENT NO. : 4,947,378

DATED : August 7, 1990

INVENTOR(S) : Toshikatsu Jinbo, et al

It is certified that error appears in the above-identified patent and that said Letters Patent is hereby corrected as shown below:

Col. 12, line 68, delete "elment" and insert --element--.

Signed and Sealed this

Fourteenth Day of January, 1992

Attest:

HARRY F. MANBECK, JR.

*Attesting Officer*   *Commissioner of Patents and Trademarks*